United States Patent [19]

Blahut et al.

[11] 4,139,907
[45] Feb. 13, 1979

[54] INTEGRATED READ ONLY MEMORY

[75] Inventors: Donald E. Blahut, Holmdel; James A. Cooper, Jr., Millington, both of N.J.

[73] Assignee: Bell Telephone Laboratories, Incorporated, Murray Hill, N.J.

[21] Appl. No.: 829,570

[22] Filed: Aug. 31, 1977

[51] Int. Cl.² ............................................. G11C 11/40
[52] U.S. Cl. ...................................... 365/104; 365/96
[58] Field of Search .................. 365/96, 103, 104, 105

[56] References Cited

U.S. PATENT DOCUMENTS

| | | | |
|---|---|---|---|
| 3,529,299 | 9/1970 | Chung et al. | 340/173 R |
| 3,721,964 | 3/1973 | Barrett et al. | 340/173 R |

*Primary Examiner*—Terrell W. Fears
*Attorney, Agent, or Firm*—Herbert M. Shapiro

[57] ABSTRACT

The word conductors of a semiconductor integrated ROM are foreshortened where permitted by the organization of data in the memory. The space made available by the eliminated portions of the word conductors is used for electrical connection to the bit conductors from the sides of the array rather than at the ends. A space reduction of about thirty percent is achieved.

6 Claims, 3 Drawing Figures

INTEGRATED READ ONLY MEMORY

FIELD OF THE INVENTION

This invention relates to semiconductor integrated circuit arrays.

BACKGROUND OF THE INVENTION

A common characteristic of semiconductor integrated circuit arrays such as a read only memory (ROM) is a pattern of x and y electrical conductors which intersect at cross points at which bit locations are defined. It is also common that the x and y conductors are formed with two different materials (metallic and polysilicon) at two different levels adjacent the semiconductor material and are separated by an insulating layer.

Frequently, the y conductors, hereinafter designated "bit conductors," are alternated with electrically conducting ground lines formed at the same level. Information is stored permanently in such a memory, for example, by forming a switchable short circuit between a selected y conductor and a ground line, switched via an x conductor at a bit location at the intersection of the two conductors. Switching is accomplished, for example, by an N-channel MOS device with a gate accessed via the x conductor.

In this type of arrangement, it is common for each bit conductor to be connected to a drain electrode of, for example, a P-channel MOS device, the source of which is connected to a supply voltage $V_{DD}$. The gates of the P-channel devices similarly are connected electrically in parallel to a source of signals $\phi$. The ground lines are connected electrically in parallel to the drain of an N-channel MOS device, the source of which is connected to ground. Signals $\phi$ also are applied to the gate of the (common) N-channel device. Thus, when the P-channel devices are activated, the N-channel device is deactivated and vice versa. Information is stored permanently in such an arrangement by connecting a bit conductor electrically to the next adjacent ground line at a prescribed cross point between the bit conductor and the intersecting x conductor, connection being made through the N-channel device gated via the x conductor as described above.

In the illustrative example described hereinafter, the ROM is word organized and, accordingly, the x conductors are designated "word conductors." In operation of such a ROM with ground lines as described, the signals $\phi$ are applied to the gates of all the P-channel devices and the (common) N-channel device and electrical currents flow through the bit conductors to the associated ground lines, where short circuits occur at preset bit locations, through the N-channel device to ground. Where a bit conductor and an associated ground line are not shorted together, a voltage difference exists therebetween and a detector connected to the bit conductors indicates this condition.

A ROM is accompanied by a translator or decoder which is operative to select word conductors during operation. In integrated circuit arrangements, the decoder and ROM are formed as part of a single integrated circuit where the decoder is of a form similar to the ROM but turned 90° with respect thereto with metallic "bit conductors" therein electrically connected to polysilicon word conductors of the ROM.

In a microprocessor, the decoder and ROM structures are sometimes also used as a (so-called) programmable logic array (PLA) operative to control various other logic circuits defined in a single semiconductor chip. Electrical conductors connecting the bit conductors of the ROM in prior art arrangements are gathered for external connection, at one end of the bit conductors, into a communication path (bus) which follows along the better part of two sides of the ROM occupying considerable area of the chip. Naturally, chip area is at a premium and any savings in chip area is desirable.

BRIEF DESCRIPTION OF THE INVENTION

The present invention is based on the recognition that a ROM frequently includes terminal strings of binary ones (no short circuit elements) along the word conductors. Since the number of word conductors usually greatly exceeds the number of bit conductors, the memory most often includes at least a number of word conductors equal to the number of bit conductors where such terminal strings occur. It was realized further that a word conductor may be discontinued in each instance where such a string starts and that electrical connection to a bit conductor may be made in the space made available by the foreshortened word conductor. The electrical connections can be made using polysilicon in the same level as the (polysilicon) word conductors and appear as breaks in the word conductors. Considerable savings in area results.

DETAILED DESCRIPTION

Figure 1:
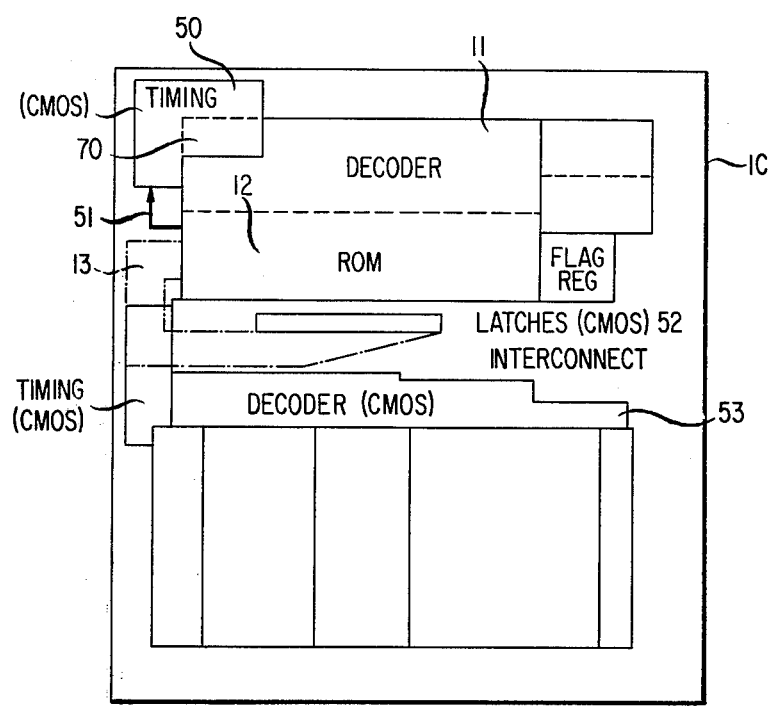
FIG. 1 is a block diagram of a portion of an integrated circuit microprocessor.

FIG. 1 shows a block diagram of an integrated circuit chip IC operative as a microprocessor. The chip includes a logic array, PLA, comprising a decoder 11 and a ROM 12. Both the decoder and the ROM are well understood elements and are not discussed in full detail herein. Rather, the elements and the organization thereof are represented schematically in order to illustrate the topological nature of the invention and the advantages thereof.

The block diagram of the figure is representative of the space utilization of an IC. The figure shows, in phantom, an area 13 which would be occupied normally by lead connections to bit connections in accordance with prior art teachings. It is this area which is saved when the word conductors of a PLA terminate at an intersection with a bit conductor at which a short circuit element to ground occurs and beyond which no further short circuit elements are required.

Figure 2:
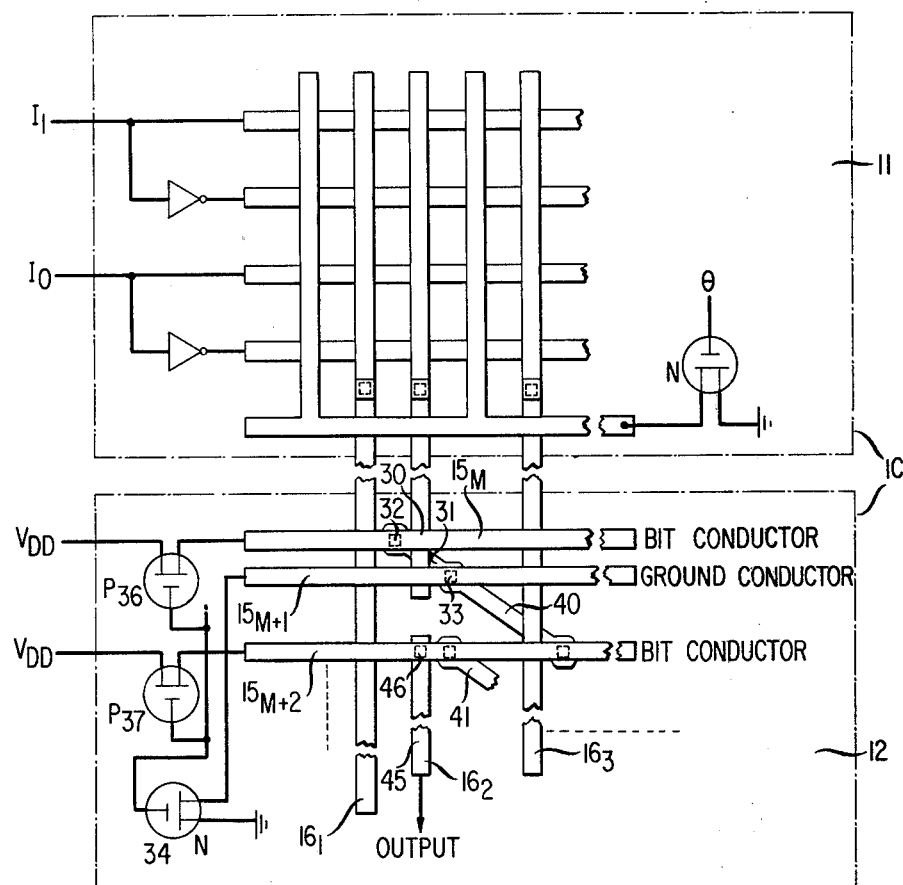
FIG. 2 is a schematic diagram of a ROM and decoder for the PLA of the microprocessor of FIG. 1.

FIG. 2 shows, schematically, the organization of the PLA in FIG. 1. The ROM comprises alternating bit conductors and ground lines $15_M$, $15_{M+1}$, $15_{M+}$... extending horizontally as received in the figure with intersecting word conductors. The word conductors are designated $16_1$, $16_2$, $16_3$... and extend vertically as viewed in the figure. The word conductors are formed typically of polysilicon material in a plane or level adjacent the semiconductor layer. The polysilicon layer is coated with an insulating layer in preparation for a second level of metal from which the bit conductors and ground lines are formed. The bit conductors and the word conductors intersect to form bit locations at which MOS devices are selectively placed to incorporate information as is well understood.

Figure 3:
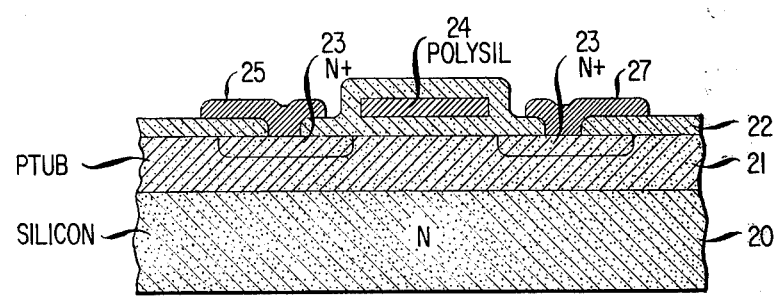
FIG. 3 is a cross sectional diagram of the ROM of FIG. 2 at an intersection therein.

FIG. 3 shows a cross section of an MOS device formed at such an intersection. A typical construction employs an N-type silicon substrate 20 on which a P-type (TUB) layer 21 is formed typically by diffusion. An oxide layer 22 is patterned to define diffused N-type regions 23. Polysilicon word conductors are represented at 24 with metallic bit conductors represented at 25. The ground lines are represented at 27.

The short circuit elements are provided at predetermined ones of the intersections in a well understood manner. For example, at intersection 30 in FIG. 2, short circuit element 31 connects bit conductor $15_M$ at opening 32 in the oxide layer. Element 31 also connects ground line $15_{M+1}$ at opening 33. Because of the short circuit element, when signal $V_{DD}$ is applied bit conductor $15_M$ is grounded through element 31, ground line $15_{M+1}$, and (now closed) N-channel device 31. The pattern of short circuit elements determines which bit conductors are high in response to the signals $V_{DD}$ when signal $\phi$ is applied to P-channel devices (36 and 37).

Read out of the memory occurs in response to a signal applied to a word conductor (i.e., the word conductor goes high). This may be understood from the representative cross section view of FIG. 3. Consider the polysilicon word conductor (24) of FIG. 3 to correspond to the word conductor $16_2$ of FIG. 2 and bit conductor (25) and ground line (27) of FIG. 3 to correspond to bit conductor $15_M$ and ground line $15_{M+1}$ of FIG. 2. A signal on word conductor $16_2$ then would produce a conducting channel between the N+ regions 23 of FIG. 3. In the absence of an N-channel MOS device at 31, an output signal is observed on bit conductor $15_M$. Because of the presence of element 31 no signal occurs. It is clear then that the pattern of short circuit elements determines the output of the ROM.

The selection of word conductors for a read operation is determined by the decoder portion 11 of the PLA. This determination, as well as the organization of the decoder, is well understood in the art and not discussed further herein.

What is important for an understanding of the invention is that the pattern of bit conductors and word conductors define intersections and that the pattern of short circuit elements associated with those intersections determines the outputs from the ROM. Such a ROM is characterized by a number of short circuit elements associated with any particular word conductor. That is to say, if we look along a given word conductor of a ROM, we will find a number of short circuit elements associated with the intersections defined along that word conductor. For example, in FIG. 2 elements 40 and 41 are associated with intersections defined along word line $16_3$. Similarly, a number of short circuit elements can be understood to be associated with word line $16_2$ with element 31 being taken as the last such element associated with intersection 30. Word conductor $16_2$ is terminated at intersection 30 leaving unused the space in the polysilicon layer overlying bit conductor $15_{M+2}$ and other ground lines and bit conductors (not shown) therebelow as viewed. It is this unused space which is used to make lead connections to the bit conductors exposed by the termination of the word conductors mid-memory in accordance with this invention.

This foreshortening of word conductor lengths from their "true" lengths, in accordance with prior art teaching, allows space in the polysilicon level to form lead connections to the bit conductors as is represented by element 45 in FIG. 2. Electrical connection is made to the bit conductors by means of aperture 46 in the insulating layer between the word and bit conductor levels.

A typical ROM has perhaps 150 word conductors and 27 bit conductors. A certain number of bit conductors are connected to other functional elements of an integrated chip from the end merely because a function element occupies a position in the chip at the end of the ROM. One such element is shown as block 50 in FIG. 1 entitled "Timing CMOS." The bit conductor connections are indicated at 51 in FIG. 1 and may represent six of the 27 bit conductor connections. The area in FIG. 1 designated 13 is the area which would be occupied by lead connections to functional elements such as indicated by block 52 entitled "Latches (CMOS)" and block 53 entitled "Decoders (CMOS)." Area 13 represents 21 of the bit conductor connections of our illustrative ROM. Since each connection requires perhaps 15 microns, area 13 is 21 times 15 microns by an average of about 2200 microns long or an area of 693,000 square microns. This area is saved by the foreshortening of the word conductors in the ROM for freeing space in the polysilicon level for electrical conductors connecting the bit conductors from the side of the ROM. Blocks 52 and 53, as well as an interconnect area, are shown occupying space formerly, and unnecessarily, occupied by bit conductor connections.

In the illustrative ROM, 21 word conductors would need to be foreshortened to free space for connecting 21 of the 27 bit conductors for side connection. The pattern of information in the memory determines which word conductors can be foreshortened. If we adopt the usual convention that a short circuit element represents a binary zero and the absence of such an element represents a binary one, then the occurrence of any terminal string of ones along a word conductor is permissive of the foreshortening of that word conductor. In a group of 150 word conductors, the probability of a terminal string of ones occurring approaches one.

Typically, the information pattern is such that the foreshortened word conductors have a random distribution in the ROM. The appearance in a photographic blowup of the ROM is something reminiscent of runs in silk stockings. But information can be organized so that all the strings of ones can be collected into a single area as would be clear to one skilled in the art. Although the collection into a single area is not particularly important to make contact to bit conductors, the importance is underscored if we remember that decoder 11 is organized much like the ROM where the vertical lines as viewed in FIG. 2 are in the metallic level and the horizontal lines are in the polysilicon level. The collection of foreshortened conductors in the decoder produces a free area which can be used for an enlarged or additional functional circuit. This is particularly clear when it is realized that both the vertical and horizontal lines can be foreshortened as described herein. Such a free area is shown in FIG. 1 as area 70.

What has been described is considered merely illustrative of the principles of this invention. Accordingly, various modifications thereof may be devised by those skilled in the art within the spirit and scope of this invention as encompassed by the following claims.

What is claimed is:

1. A semiconductor memory having a layer of semiconductor material and adjacent word and bit conductors separated by electrically insulating material and defining intersections therebetween, said memory including a predetermined pattern of switchable short circuit elements each connecting one of said bit conductors to a reference potential at one of said intersections, said memory being characterized by a pattern of word conductors which terminate at ones of said intersections at which said elements occur for exposing remaining bit conductors therebeyond for making lead connections thereto.

2. A memory in accordance with claim 1 also including a pattern of electrical conductors, each of which overlies ones of said remaining bit conductors corresponding to a single terminated word conductor, each of said electrical conductors being electrically connected to one of said bit conductors.

3. A memory in accordance with claim 2 wherein said bit conductors are alternated with a parallel set of ground lines, and each of said elements electrically connect a bit conductor and a next adjacent ground line at one of said intersections, and means responsive to a first signal for electrically connecting said bit conductors and grounding said ground lines.

4. A memory in accordance with claim 3 also including means integrated therewith for selectively activating said word conductors.

5. A memory in accordance with claim 4 wherein said foreshortened word lines are collected in a single area.

6. A memory in accordance with claim 1 wherein said bit and word conductors are formed in first and seconds levels adjacent said layer, said word conductors which terminate leaving free space in said second level overlying said bit conductors, said second level also including electrical conductors aligned with said word conductors and spaced therefrom, said electrical conductors being connected to preselected bit conductors through said insulating layer.

* * * * *